United States Patent
Byun et al.

(10) Patent No.: US 9,147,685 B2
(45) Date of Patent: Sep. 29, 2015

(54) SEMICONDUCTOR MEMORY DEVICES INCLUDING SUPPORT PATTERNS

(71) Applicant: Samsung Electronics Co., Ltd., Suwon-si (KR)

(72) Inventors: Kyungmun Byun, Seoul (KR); Hyongsoo Kim, Hwaseong-si (KR); Mansug Kang, Suwon-si (KR); Eunkee Hong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/475,844

(22) Filed: Sep. 3, 2014

(65) Prior Publication Data
US 2014/0367755 A1    Dec. 18, 2014

Related U.S. Application Data

(62) Division of application No. 13/371,127, filed on Feb. 10, 2012, now Pat. No. 8,835,315.

(30) Foreign Application Priority Data

Feb. 28, 2011  (KR) .................. 10-2011-0017872

(51) Int. Cl.
*H01L 27/108* (2006.01)
*H01L 49/02* (2006.01)

(52) U.S. Cl.
CPC .......... *H01L 27/10808* (2013.01); *H01L 28/90* (2013.01); *H01L 27/10852* (2013.01)

(58) Field of Classification Search
CPC ... H01L 27/10852; H01L 28/91; H01L 28/90; H01L 27/10817; H01L 28/40; H01L 2224/32145
See application file for complete search history.

(56) References Cited

U.S. PATENT DOCUMENTS

| | | | |
|---|---|---|---|
| 6,407,011 B1 * | 6/2002 | Ikeda et al. | 438/786 |
| 7,067,385 B2 | 6/2006 | Manning | |
| 7,125,781 B2 * | 10/2006 | Manning et al. | 438/397 |
| 7,153,740 B2 * | 12/2006 | Kim et al. | 438/253 |
| 7,271,051 B2 * | 9/2007 | Manning et al. | 438/238 |
| 7,387,939 B2 * | 6/2008 | Manning | 438/396 |
| 7,387,962 B2 * | 6/2008 | Lee et al. | 438/687 |
| 7,402,488 B2 * | 7/2008 | Cho et al. | 438/253 |
| 7,420,238 B2 * | 9/2008 | Manning et al. | 257/301 |
| 7,449,391 B2 * | 11/2008 | Manning et al. | 438/396 |
| 7,585,741 B2 * | 9/2009 | Manning | 438/396 |
| 7,655,968 B2 * | 2/2010 | Manning | 257/302 |
| 7,666,797 B2 * | 2/2010 | Shea et al. | 438/744 |
| 7,670,903 B2 | 3/2010 | Park et al. | |
| 7,682,924 B2 | 3/2010 | Bhat et al. | |
| 8,076,241 B2 * | 12/2011 | Cerio et al. | 438/678 |

(Continued)

FOREIGN PATENT DOCUMENTS

| KR | 100716641 B1 | 5/2007 |
|---|---|---|
| KR | 10-2007-0057575 A | 6/2007 |

(Continued)

*Primary Examiner* — Jaehwan Oh
(74) *Attorney, Agent, or Firm* — Myers Bigel Sibley & Sajovec, P.A.

(57) ABSTRACT

A capacitor dielectric can be between the storage node and the electrode layer. A supporting pattern can be connected to the storage node, where the supporting pattern can include at least one first pattern and at least one second pattern layered on one another, where the first pattern can include a material having an etch selectivity with respect to the second pattern.

10 Claims, 16 Drawing Sheets

(56) References Cited

U.S. PATENT DOCUMENTS

| | | |
|---|---|---|
| 8,404,555 B2 * | 3/2013 | Wang .................. 438/396 |
| 8,518,788 B2 * | 8/2013 | Lee ..................... 438/381 |
| 2001/0005631 A1 * | 6/2001 | Kim et al. ............ 438/689 |
| 2005/0153518 A1 * | 7/2005 | You et al. ............ 438/397 |
| 2005/0176210 A1 * | 8/2005 | Kim et al. ............ 438/386 |
| 2005/0287738 A1 * | 12/2005 | Cho et al. ............ 438/253 |
| 2006/0113580 A1 * | 6/2006 | Cho et al. ............ 257/306 |
| 2006/0211178 A1 * | 9/2006 | Kim et al. ............ 438/129 |
| 2007/0087567 A1 * | 4/2007 | Lee et al. ............. 438/687 |
| 2008/0009119 A1 | 1/2008 | Eto |
| 2009/0068814 A1 | 3/2009 | Cho et al. |
| 2009/0121315 A1 * | 5/2009 | Baars et al. ......... 257/532 |
| 2009/0286377 A1 * | 11/2009 | Manning ............. 438/381 |
| 2010/0117196 A1 * | 5/2010 | Manning ............. 257/532 |
| 2011/0034039 A1 * | 2/2011 | Liang et al. ......... 438/788 |
| 2012/0040507 A1 * | 2/2012 | Lee ..................... 438/381 |

FOREIGN PATENT DOCUMENTS

| | | |
|---|---|---|
| KR | 10-0806142 B1 | 2/2008 |
| KR | 10-0885922 B1 | 2/2009 |
| KR | 10-2009-0045739 A | 5/2009 |
| KR | 10-2011-0055246 | 5/2011 |

\* cited by examiner

US 9,147,685 B2

SEMICONDUCTOR MEMORY DEVICES INCLUDING SUPPORT PATTERNS

CROSS-REFERENCE TO RELATED APPLICATIONS

This application is a divisional of U.S. patent application Ser. No. 13/371,127, filed Feb. 10, 2012, which claims priority under 35 U.S.C. §119 to Korean Patent Application No. 10-2011-0017872 filed on Feb. 28, 2011, in the Korean Intellectual Property Office, and the benefit accruing therefrom under 35 U.S.C. §119. The disclosures of the above referenced applications are hereby incorporated by reference herein in their entireties

BACKGROUND

Embodiments of the inventive concepts relate generally to a semiconductor memory device and a method of fabricating the same. More particularly, embodiments of the inventive concepts relate to a semiconductor memory device including capacitor and a method of fabricating the same.

An integration density and reliability of a semiconductor memory device should be increased to meet a growing demand for lightweight, small-sized, high speed, multifunctional, high performance, highly reliable and low cost devices. For a highly integrated semiconductor memory device, the reliability may be improved by increasing the capacitance of a capacitor, or an aspect ratio of a capacitor lower electrode.

SUMMARY

In some embodiments according to the inventive concept, a semiconductor memory device can include a storage node and an electrode layer disposed on a substrate. A capacitor dielectric can be between the storage node and the electrode layer. A supporting pattern can be connected to the storage node, where the supporting pattern can include at least one first pattern and at least one second pattern layered on one another, where the first pattern can include a material having an etch selectivity with respect to the second pattern.

In some embodiments according to the inventive concept, the first pattern can include an insulating carbon-nitrogen compound, and the second pattern can include an insulating carbon-free compound. In some embodiments according to the inventive concept, the first pattern can include a material that is deposited at a first deposition rate and the second pattern can include a material that is deposited at a second deposition rate, where the first deposition rate is less than the second deposition rate.

In some embodiments according to the inventive concept, the supporting pattern can include a pair of the first patterns and the second pattern between the pair of the first patterns. In some embodiments according to the inventive concept, one of the pair of the first patterns can include a material that exhibits a tensile stress characteristic and the other of the pair can include a material that exhibits a compressive stress characteristic. A first portion of the second pattern can be in contact with one of the first patterns that exhibits the tensile stress characteristic and a second portion of the second pattern can be in contact with the other of the first patterns that exhibits the compressive stress characteristic, where the first portion of the second pattern exhibits a tensile stress characteristic and the second portion of the second pattern exhibits a compressive stress characteristic.

In some embodiments according to the inventive concept, a method of fabricating a semiconductor memory device can be provided by forming a first mold layer and a second mold layer on a substrate. A storage node can be formed on the substrate to penetrate the first and second mold layers and a supporting pattern can be between the first and second mold layers, where the supporting pattern can include at least one first pattern and at least one second pattern, and where the first pattern can include a material having an etch selectivity with respect to the second pattern. The first and second mold layers can be removed and a capacitor dielectric can be formed on the substrate to conformally cover a surface of the storage node, and an electrode layer can be formed on the substrate.

In some embodiments according to the inventive concept, forming the first and second mold layers and the supporting pattern can be provided by forming the first mold layer on the substrate and forming a supporting layer that includes at least one first layer and at least one second layer on the first mold layer. The supporting layer can be patterned to expose an upper surface of the first mold layer.

In some embodiments according to the inventive concept, the at least one first layer can be formed by a chemical vapor deposition process using a carbon-containing source gas, and the at least one second layer can be formed by a carbon-free chemical vapor deposition process. In some embodiments according to the inventive concept, the at least one first layer can be deposited at a first deposition rate and the at least one second layer can be deposited at a second deposition rate, where the first deposition rate can be less than the second deposition rate.

In some embodiments according to the inventive concept, the semiconductor memory device can include a plurality of a vertically oriented capacitor storage nodes that are spaced apart from one another on a substrate each having sidewalls. A supporting pattern can be above and spaced apart from the substrate, and can bridge between ones of the plurality of vertically oriented capacitor storage nodes, which can be configured to maintain the sidewall parallel to one another and vertical relative to the substrate.

BRIEF DESCRIPTION OF THE DRAWINGS

Example embodiments will be more clearly understood from the following brief description taken in conjunction with the accompanying drawings.

FIG. 1 is a perspective view of a semiconductor memory device according to example embodiments of the inventive concepts;

FIGS. 2 through 9 are perspective views illustrating methods of fabricating a semiconductor memory device according to example embodiments of the inventive concepts;

FIGS. 10 through 14 are perspective views illustrating methods of fabricating a semiconductor memory device according to other embodiments of the inventive concepts;

FIG. 15 is a schematic block diagram illustrating an example of electronic systems including semiconductor memory devices according to embodiments of the inventive concept; and FIG. 16 is a schematic block diagram illustrating an example of memory cards including the semiconductor memory devices according to the embodiments of the inventive concept.

DETAILED DESCRIPTION OF EMBODIMENTS ACCORDING TO THE INVENTIVE CONCEPT

Figure 1:
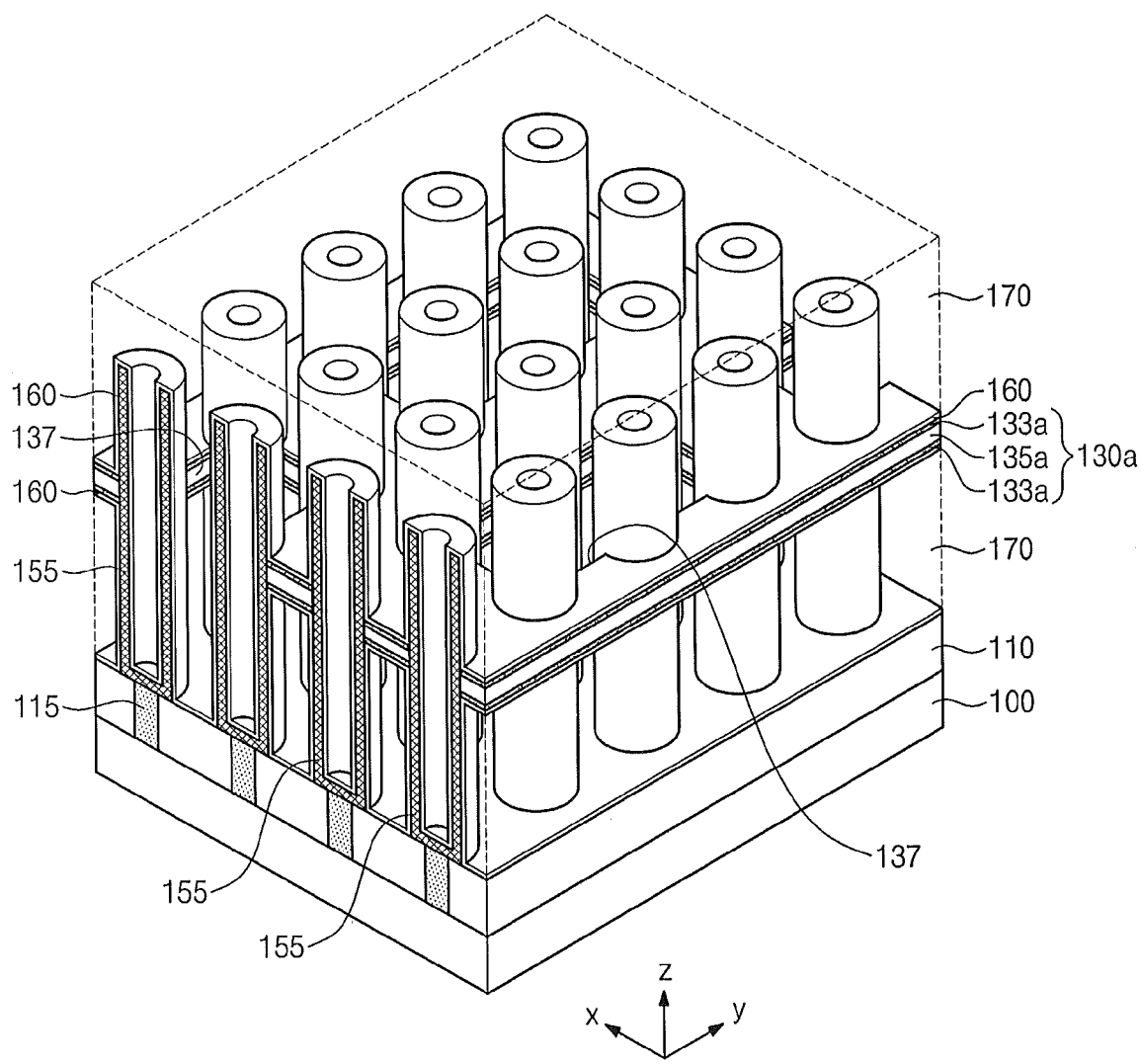
FIGS. 1 through 16 represent non-limiting, example embodiments as described herein.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments of the inventive concept are described with reference to the accompanying drawings. FIG. 1 is a perspective view of the semiconductor memory device according to example embodiments of the inventive concept.

Referring to FIG. 1, an interlayer dielectric 110 may be provided on a substrate 100. The substrate 100 may be a silicon substrate, a germanium substrate, a silicon-germanium substrate, and so forth. The interlayer dielectric 110 may include a dielectric material. For instance, the interlayer dielectric 110 may include at least one of oxide, nitride and/or oxynitride.

Contact plugs 115 may be provided on the substrate 100 to penetrate the interlayer dielectric 110. The contact plugs 115 may include at least one of semiconductor materials (e.g., polysilicon), metal-semiconductor compounds (e.g., tungsten silicide), conductive metal nitrides (e.g., titanium nitride, tantalum nitride or tungsten nitride), or metals (e.g., titanium, tungsten, or tantalum).

A plurality of word lines and a plurality of bit lines may be provided on the substrate 100 to cross each other, and the word and bit lines may be covered with the interlayer dielectric 110. Doped regions may be provided in the substrate 100 at both sides of the respective word lines, and each of the contact plugs 115 may be coupled to the corresponding one of the doped regions.

Storage nodes 155 may be provided on the interlayer dielectric 110. Each of the storage nodes 155 may be electrically coupled to the corresponding one of the contact plugs 115. In some embodiments, the lowermost surface of the storage node 155 may be in contact with a top surface of the contact plug 115.

In some embodiments, the storage node 155 may include a plate portion having a bottom surface parallel to the substrate 100 and a sidewall portion upward extending from an edge of the plate portion. In other words, the storage node 155 may be shaped like a hollow cylinder having one open end (i.e., a cup shape). In this case, the bottom surface of the plate portion of the storage node 155 may be in contact with the top surface of the contact plug 115.

The storage nodes 155 may include a conductive material. For instance, the storage nodes 155 may include at least one of a doped semiconductor layer, a conductive metal nitride layer (e.g., of titanium nitride, tantalum nitride, or tungsten nitride), a metal layer (e.g., of ruthenium, iridium, titanium, or tantalum), and a conductive metal oxide layer (e.g., of iridium oxide).

An electrode layer 170 may be provided on the interlayer dielectric 110 to cover (or encapsulate) the storage nodes 155. The electrode layer 170 may include at least one of a doped semiconductor layer, a conductive metal nitride layer (e.g., of titanium nitride, tantalum nitride, or tungsten nitride), a metal layer (e.g., of ruthenium, iridium, titanium, or tantalum), and a conductive metal oxide layer (e.g., of iridium oxide).

A supporting pattern 130a may be provided on the interlayer dielectric 110. The supporting pattern 130a may be in contact with at least a portion of the sidewall portion of the respective storage nodes 155. Due to this contact, the storage nodes 155 can be mechanically or structurally supported by the supporting pattern 130a. In some embodiments, the supporting pattern 130a may be disposed in the electrode layer 170.

In some embodiments, the supporting pattern 130a may include a plurality of openings 137. An inner wall of the respective openings 137 may be in contact with plural ones of the storage nodes 155. For instance, plural ones of the storage nodes 155 are disposed in the respective openings of the supporting pattern 130a. But example embodiments of the inventive concepts may not be limited thereto, and a shape of the supporting pattern 130a may be variously modified.

The supporting pattern 130a may include a pair of first patterns 133a and a second pattern 135a interposed between the pair of the first patterns 133a. The pair of the first patterns 133a may include a material having an etch selectivity with respect to the second pattern 135a. In other words, the pair of the first patterns 133a may include a material having a slower etch rate than a material of the second pattern 135a, with respect to a specific etchant. For instance, the pair of the first patterns 133a may include an insulating carbon-nitrogen compound, and the second pattern 135a may include an insulating nitride. In some embodiments, the specific etchant may be ammonium fluoride (NH$_4$F), hydrogen fluoride (HF) and/or a water-containing LAL solution.

The first patterns 133a may include a material deposited at a first deposition rate, and the second pattern 135a may include a material deposited at a second deposition rate. In some embodiments, the first deposition rate may be less than the second deposition rate.

In some embodiments, the second pattern 135a may include a first portion exhibiting a tensile stress characteristic and a second portion exhibiting a compressive stress characteristic. In addition, one of the pair of the first patterns 133a may exhibit a tensile stress characteristic, and the other may exhibit a compressive stress characteristic. The first portion of the second pattern 135a may be in contact with one of the first patterns 133a exhibiting the tensile stress characteristic, and the second portion of the second pattern 135a may be in contact with the other exhibiting the compressive stress characteristic of the first patterns 133a.

In some embodiments according to the inventive concept, one of the pair of the first patterns 133a may be omitted. For instance, the supporting pattern 130a may consist of one first pattern 133a and one second pattern 135a.

According to some embodiments of the inventive concept, the first patterns 133a of the supporting pattern 130a may include a material having an etch selectivity with respect to the second pattern 135a of the supporting pattern 130a. This enables support of the storage nodes 155 using the supporting pattern 130a. In addition, the second pattern 135a may include a material deposited at the second deposition rate, and the first pattern 133a may include a material deposited at the first deposition rate being less than the second deposition rate. This may enable improved productivity in forming the supporting pattern 130a.

A capacitor dielectric 160 may be provided between the storage node 155 and the electrode layer 170 and between the supporting pattern 130a and the electrode layer 170. The capacitor dielectric 160 may cover a surface of the storage node 155, a surface of the supporting pattern 130a, and a top surface of the interlayer dielectric 110. The capacitor dielectric 160 may include at least one of an oxide layer (e.g., of silicon oxide), a nitride layer (e.g., of silicon nitride), an oxynitride layer (e.g., of silicon oxynitride), or a high-k dielectric (e.g., of hafnium oxide).

In some embodiments, the supporting pattern 130a may include at least one first pattern 133a and at least one second pattern 135a. The first pattern 133a may include a material having an etch selectivity with respect to the second pattern 135a. This enables the storage nodes 155 to be supported using the supporting pattern 130a. In addition, the second pattern 135a may include a material deposited at the second deposition rate, and the first pattern 133a may include a material deposited at the second deposition rate being greater than the first deposition rate. This may enable improved productivity in fabricating the semiconductor memory device and to realize a semiconductor memory device with improved reliability.

Hereinafter, methods of fabricating a semiconductor memory device according to example embodiments of the inventive concepts are described with reference to the accompanying drawings. FIGS. 2 through 9 are perspective views illustrating the methods of fabricating a semiconductor memory device according to example embodiments of the inventive concepts.

Figure 2:
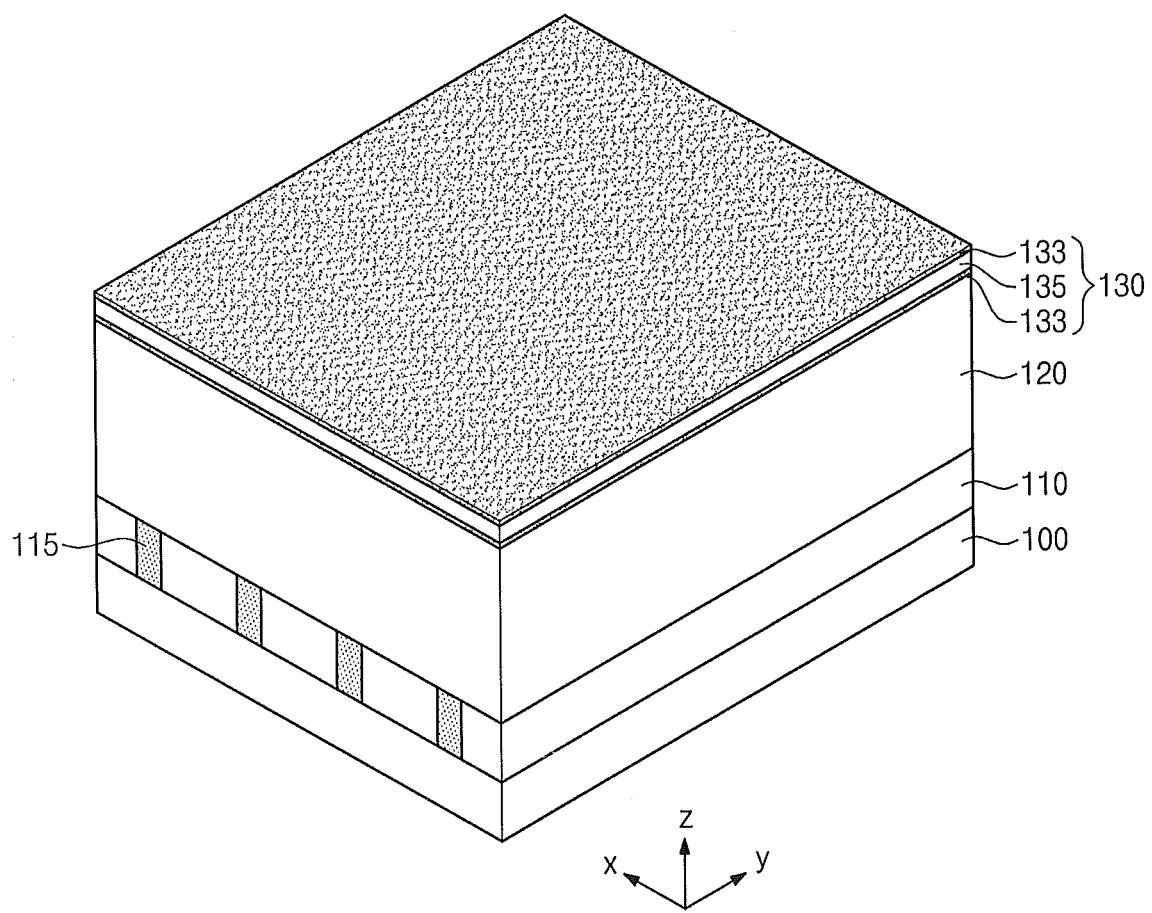

Referring to FIG. 2, an interlayer dielectric 110 may be formed on a substrate 100. The substrate 100 may include a semiconductor material. For instance, the substrate 100 may include at least one of a silicon substrate, a silicon-germanium substrate and/or a germanium substrate. The interlayer dielectric 110 may include a dielectric material. For instance, the interlayer dielectric 110 may include at least one of oxide, nitride and/or oxynitride.

Contact plugs 115 may be formed on the substrate 100 to penetrate the interlayer dielectric 110. The formation of the contact plug 115 may include forming a contact hole penetrating the interlayer dielectric 110 to expose a portion of the substrate 100 and then filling the contact hole with a conductive material. The contact plugs 115 may include at least one of semiconductor materials (e.g., polysilicon), metal-semiconductor compounds (e.g., tungsten silicide), conductive metal nitrides (e.g., titanium nitride, tantalum nitride or tungsten nitride), or metals (e.g., titanium, tungsten, or tantalum).

A plurality of word lines and a plurality of bit lines may be formed on the substrate 100 to cross each other, and the word and bit lines may be covered with the interlayer dielectric 110. Doped regions may be formed in the substrate 100 at both sides of the respective word lines, and each of the contact plugs 115 may be coupled to the corresponding one of the doped regions.

A first mold layer 120 may be formed on the interlayer dielectric 110. A supporting layer 130 may be formed on the first mold layer 120. The supporting layer 130 may include a pair of first layers 133 and a second layer 135 interposed between the pair of the first layers 133. In other words, the supporting layer 130 may have a layer structure including one of the first layers 133, the second layer 135, and the other of the first layers 133, which are sequentially stacked on the first mold layer 120.

The pair of the first layers 133 and the second layer 135 may be formed of materials having an etch selectivity with respect to the first mold layer 120. In addition, the pair of the first layers 133 may be formed of a material having an etch selectivity with respect to the second layer 135. In some embodiments, the first mold layer 120 may be an insulating oxide layer, the second layer 135 may be a carbon-free insulating nitride layer, and the first layers 133 may be insulating layers containing a carbon-nitrogen compound. For instance, the first mold layer 120 may be formed of silicon oxide, the second layer 135 may be formed of silicon nitride, and the first layers 133 may be formed of layers containing a silicon-carbon-nitrogen compound.

In some embodiments, the second layer 135 may include a first portion exhibiting a tensile stress characteristic and a second portion exhibiting a compressive stress characteristic. In addition, one of the pair of the first layers 133 may be formed to have a tensile stress characteristic, and the other may be formed to have a compressive stress characteristic. The first portion of the second layer 135 may be formed to be in contact with one of the first layers 133 exhibiting the tensile stress characteristic, and the second portion of the second layer 135 may be formed to be in contact with the other of the first layers 133 exhibiting the compressive stress characteristic.

In some embodiments, the first layers 133 may be formed by a chemical vapor deposition process using a carbon-containing source gas, and the second layer 135 may be formed by a carbon-free chemical vapor deposition process. In some embodiments, the formation of the first layers 133 and the second layer 135 may be performed in the same single reaction chamber.

In some embodiments, the first layers 133 may be formed at a first deposition rate, and the second layer 135 may be formed at a second deposition rate. The first deposition rate may be less than the second deposition rate.

An etch-stop layer and a buffer layer may be formed between the first mold layer 120 and the interlayer dielectric 110. The etch-stop layer and the buffer layer may include at least one of an oxide layer or a nitride layer.

Figure 3:
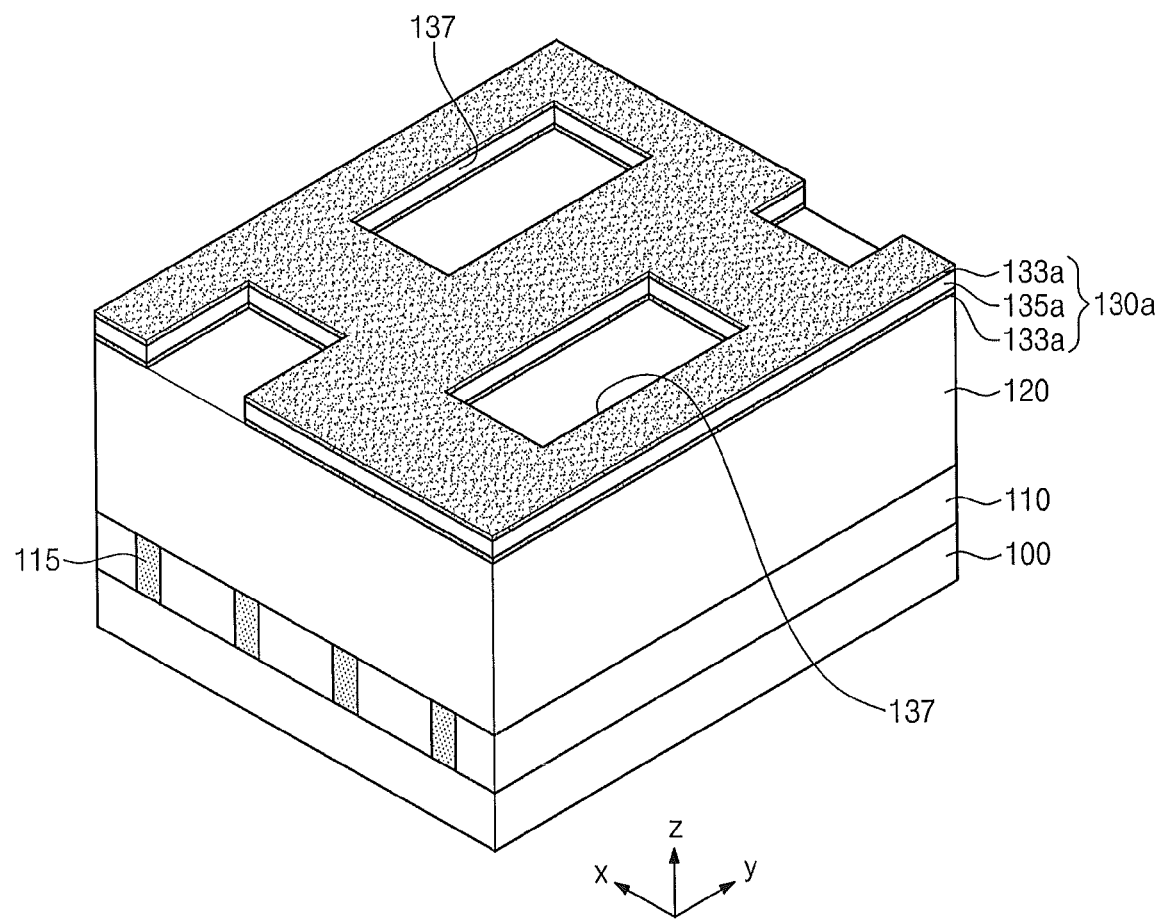

Referring to FIG. 3, the supporting layer 130 may be patterned to form a supporting pattern 130a having at least one opening. The opening may be formed to expose a top surface of the first mold layer 120. The supporting pattern 130a may include a pair of first patterns 133a and a second pattern 135a interposed between the pair of the first patterns 133a. The pair of the first patterns 133a may be a resultant structure obtained by etching the pair of the first layers 133, and the second pattern 135a may be a resultant structure obtained by etching the second layer 135.

In some embodiments, one of the pair of the layers 133 may be omitted. For instance, the supporting pattern 130a may consist of one first pattern 133a and one second pattern 135a.

Figure 4:
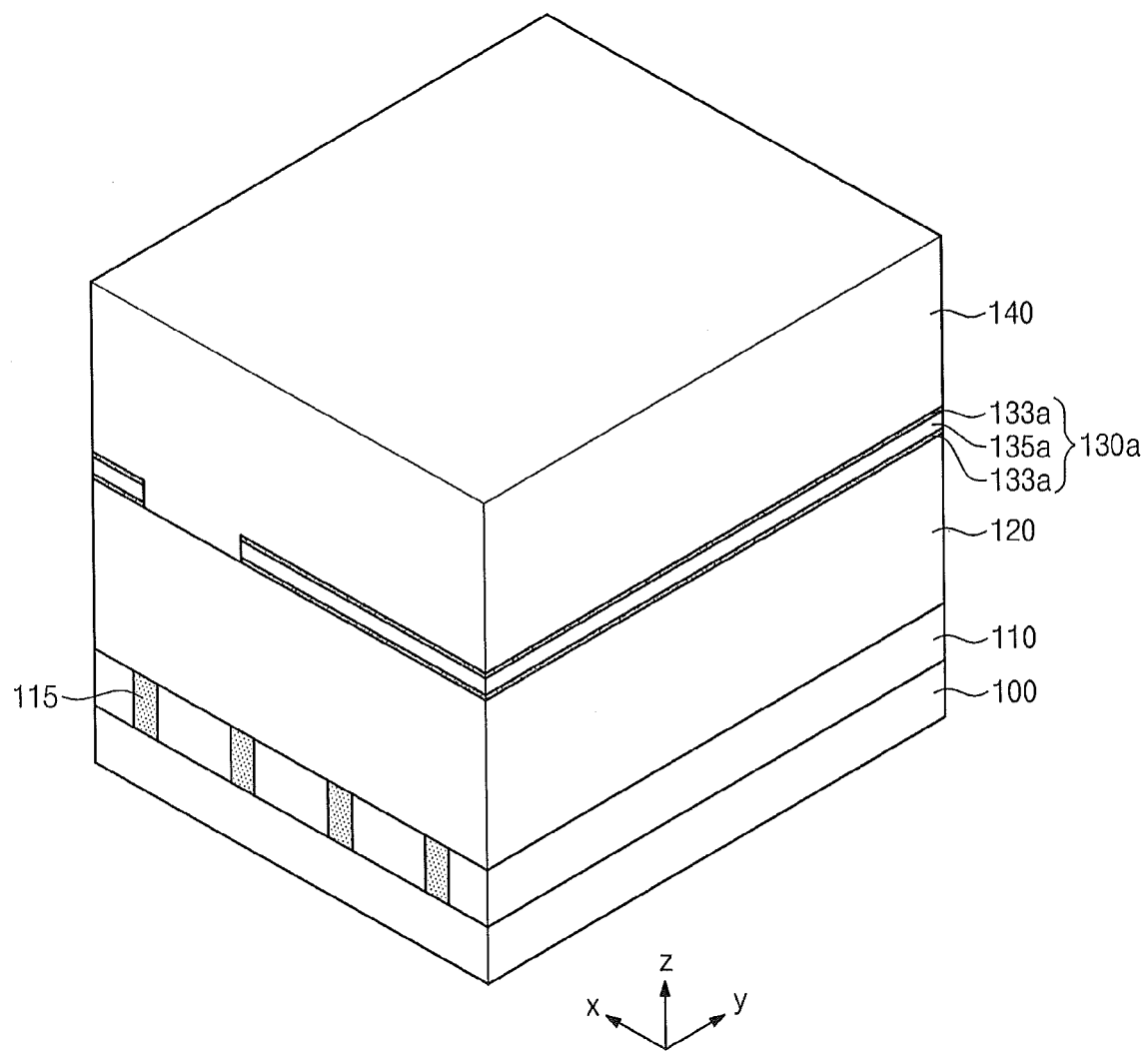

Referring to FIG. 4, a second mold layer 140 may be formed on the supporting pattern 130a. The second mold layer 140 may be formed to fill the openings of the supporting pattern 130a.

In some embodiments, the first mold layer 120 and the second mold layer 140 may include dielectric materials having an etch selectivity with respect to the supporting pattern 130. In addition, the first mold layer 120 may be formed of the same dielectric material as the second mold layer 140. For instance, both the first and second mold layers 120 and 140 may include a silicon oxide layer.

Alternatively, the second mold layer 140 may include a material having an etch selectivity with respect to the first mold layer 120, the pair of the first patterns 133a and the second pattern 135a. For instance, in the case that the first mold layer 120, the first patterns 133a, and the second pattern 135a are formed of silicon oxide, a silicon-carbon-nitrogen compound, and silicon nitride, respectively, the second mold layer 140 may be formed of silicon oxynitride.

Figure 5:
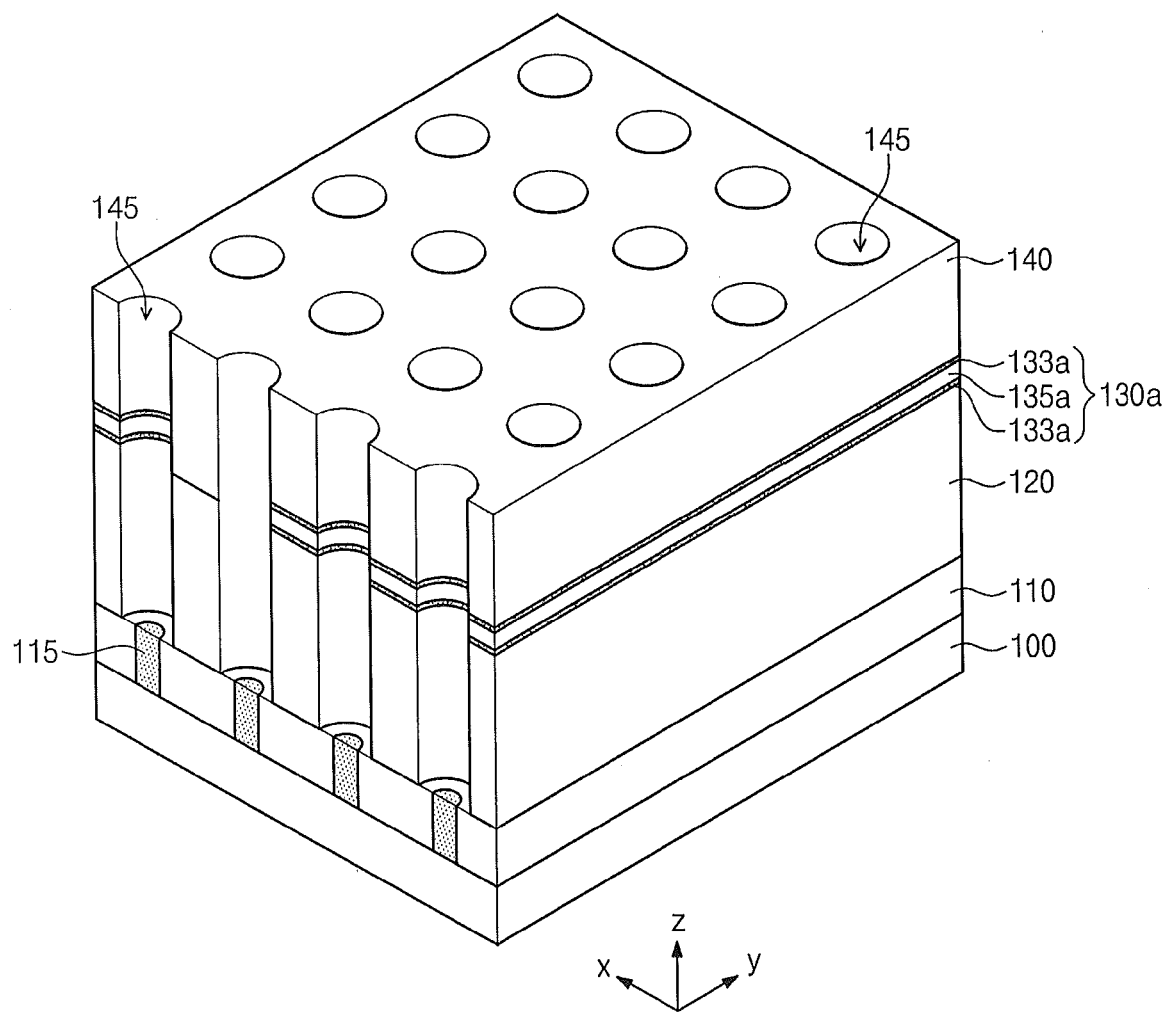

Referring to FIG. 5, holes 145 may be formed on the interlayer dielectric 110 to penetrate the second mold layer 140, the supporting pattern 130a, and the first mold layer 120. Each of the holes 145 may be formed to expose a top surface of the corresponding one of the contact plugs 115 formed in the interlayer dielectric 110.

The holes 145 may be formed by sequentially etching the second mold layer 140, the supporting pattern 130a, and the first mold layer 120. In some embodiments, the formation of the holes 145 may include etching the second mold layer 140, the supporting pattern 130a and the first mold layer 120 in the same single reaction chamber. In other embodiments, in the formation of the hole 145, at least one of the second mold layer 140, the supporting pattern 130a and the first mold layer 120 may be etched within a different reaction chamber.

In the case that the second mold layer 140 is formed of a material having an etch selectivity with respect to the first mold layer 120, it is possible to suppress the second mold layer 140 from being etched during the etching of the first mold layer 120. This may prevent a bowing phenomenon from occurring at a portion of the hole 145 near the first mold layer 120 and the second mold layer 140.

Figure 6:
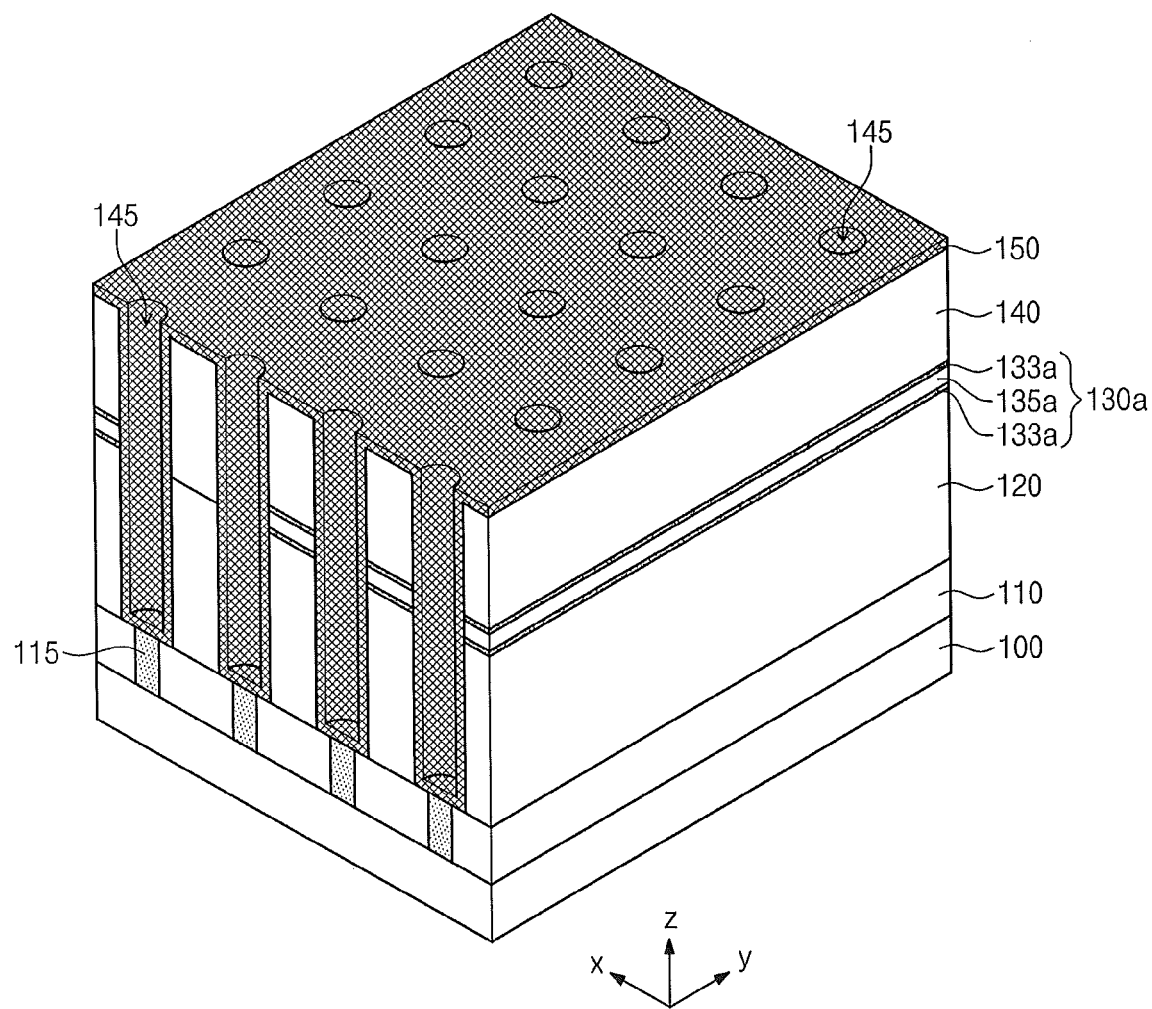

Referring to FIG. 6, a storage electrode layer 150 may be conformally formed on the interlayer dielectric 110. The storage electrode layer 150 may be formed to cover an inner surface of the hole 145 and a top surface of the second mold layer 140. As used herein, conformality is a layer property describing how closely the topography of an underlying surface is replicated. For example, a conformal layer may have outer surfaces that are substantially the same shape as the surface it covers and/or has substantially the same thickness throughout.

The storage electrode layer 150 may be formed using a physical vapor deposition process or a chemical vapor deposition process. The storage electrode layer 150 may include at least one of a doped semiconductor layer, a conductive metal nitride layer (e.g., of titanium nitride, tantalum nitride, or tungsten nitride), a metal layer (e.g., of ruthenium, iridium, titanium, or tantalum), and a conductive metal oxide layer (e.g., of iridium oxide).

Figure 7:
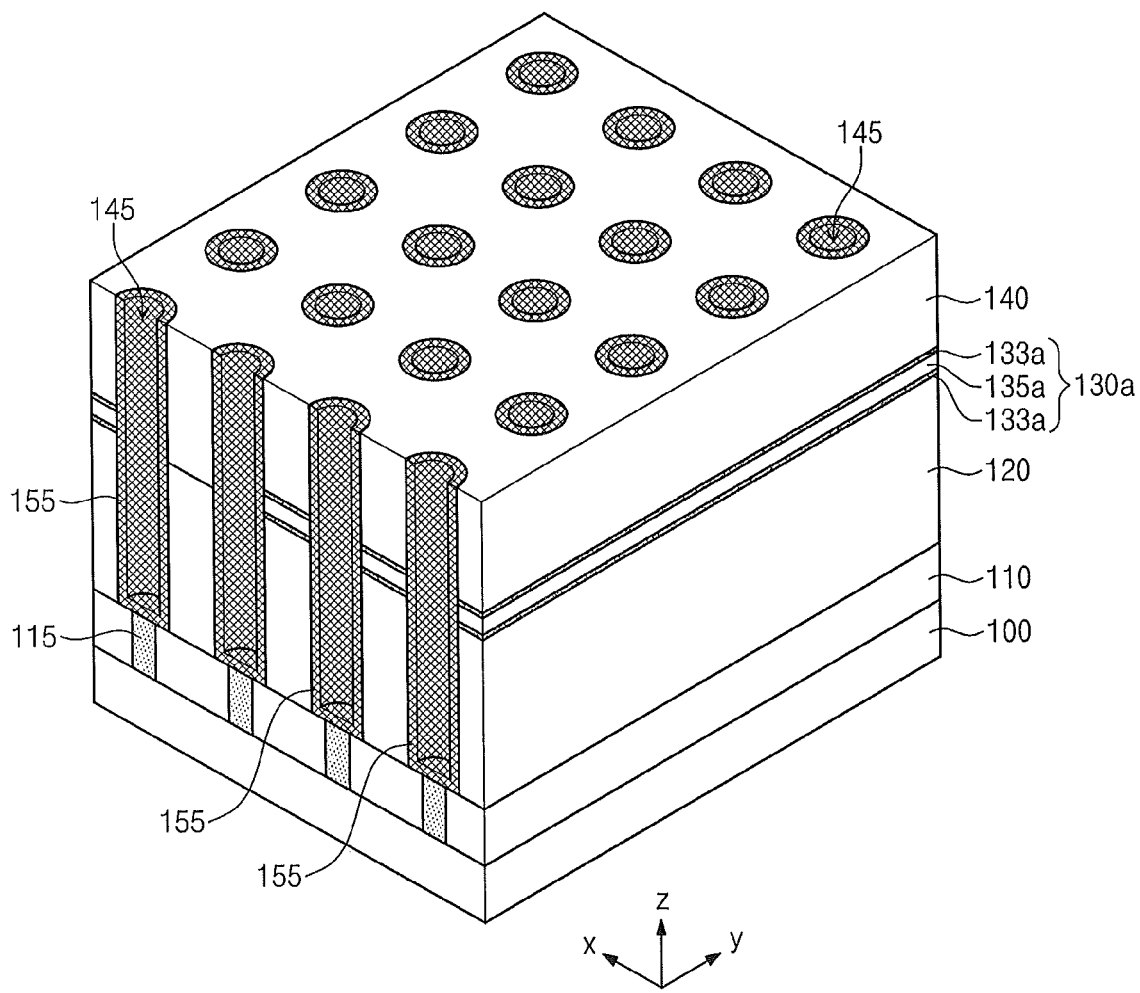

Referring to FIG. 7, the storage electrode layer 150 may be etched to expose the top surface of the second mold layer 140, thereby forming storage nodes 155 disposed respectively in the holes 145. Each of the storage nodes 155 may be electrically coupled to the corresponding one of the contact plugs 115. The storage nodes 155 may be spaced apart from each other. The etching of the storage electrode layer 150 may be performed using at least one of a dry etching process and/or a chemical mechanical polishing process.

Figure 8:
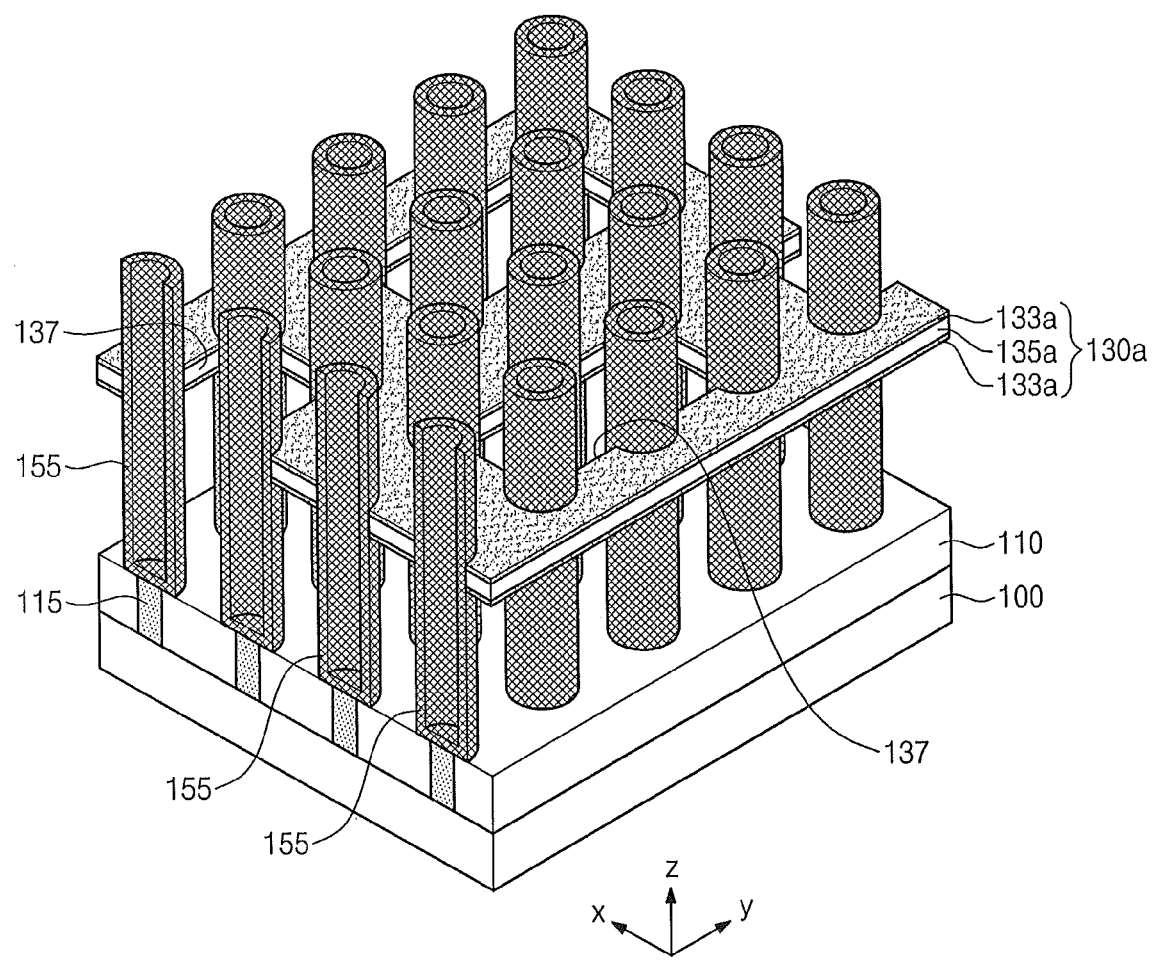

Referring to FIG. 8, the first mold layer 120 and the second mold layer 140 may be removed. As the result of the removal, surfaces of the storage nodes 155 and the supporting pattern 130a are exposed.

In some embodiments, the removal of the first mold layer 120 and the second mold layer 140 may be performed by a LAL lift-off process using ammonium fluoride ($NH_4F$), hydrogen fluoride (HF) and/or a water-containing LAL solution.

In some embodiments, the first mold layer 120 and the second mold layer 140 may be removed by the same single etching process. In other embodiments, the first mold layer 120 and the second mold layer 140 may be separately removed by a plurality of etching processes different from each other.

Figure 9:
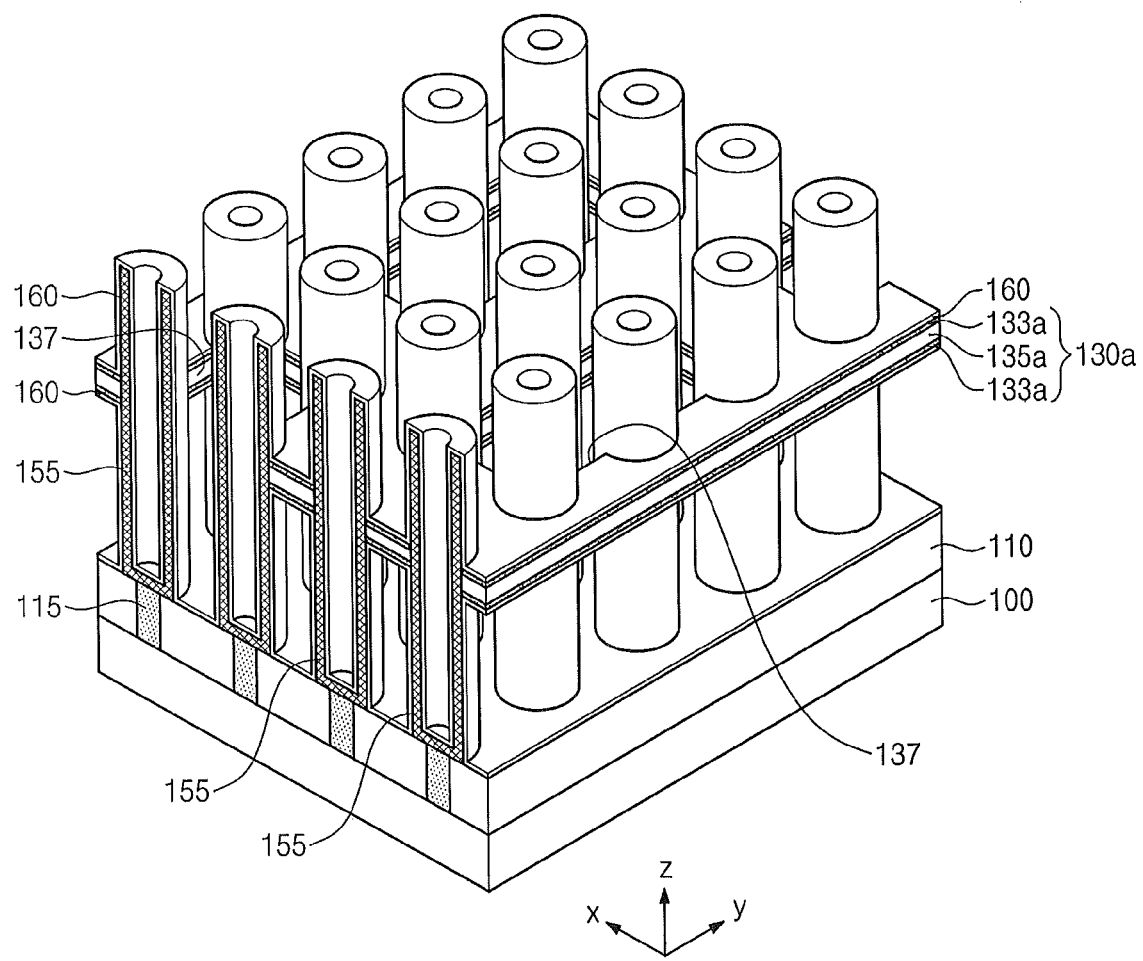

Referring to FIG. 9, a capacitor dielectric 160 may be conformally formed on the substrate 100. For instance, the capacitor dielectric 160 may be formed to cover a surface of the storage node 155, a surface of the supporting pattern 130a, and the top surface of the interlayer dielectric 110. The capacitor dielectric 160 may include at least one of an oxide layer (e.g., of silicon oxide), a nitride layer (e.g., of silicon nitride), an oxynitride layer (e.g., of silicon oxynitride), or a high-k dielectric (e.g., of hafnium oxide).

Referring back to FIG. 1, an electrode layer 170 may be formed on the interlayer dielectric 110. The electrode layer 170 may be formed to fill a space formed by removing the first mold layer 120 and the second mold layer 140 as well as the holes 145 provided with the capacitor dielectric 160. Accordingly, the capacitor dielectric 160 may be disposed between the storage nodes 155 and the electrode layer 170 and between the supporting pattern 130a and the electrode layer 170. The electrode layer 170 may include at least one of a doped semiconductor layer, a conductive metal nitride layer (e.g., of titanium nitride, tantalum nitride, or tungsten nitride), a metal layer (e.g., of ruthenium, iridium, titanium, or tantalum), and a conductive metal oxide layer (e.g., of iridium oxide).

According to example embodiments of the inventive concepts, the supporting pattern 130a may include at least one first pattern 133a and at least one second pattern 135a. Here, at least one of the first and second patterns 133a and 135a may be formed of a material having an etch selectivity with respect to the first and second mold layers 120 and 140. Accordingly, it is possible to prevent the supporting pattern 130a from being removed during the removal of the first mold layer 120 and/or the second mold layer 140. Furthermore, the first pattern 133a may be formed of a different material from the second pattern 135a; that is, the first and second patterns 133a and 135a may be formed to have an etch selectivity with each other. As a result, even in the case that one of the first and second patterns 133a and 135a is somewhat etched during the removal of the first and second mold layers 120 and 140, at least one of the first and second patterns 133a and 135a can remain to support the storage nodes 155. This may reduce product failures that could result when the storage nodes 155 lean over, and moreover to realize a semiconductor memory device with improved reliability. In addition, the first and second layers 133 and 135 of the supporting pattern 130a may be formed using deposition processes, and the second layer 135 may be formed at a deposition rate greater than that of the first layer 133. This may improve productivity in fabricating the semiconductor memory device.

Hereinafter, a method of fabricating a semiconductor memory device according to other embodiments of the inventive concepts will be described in more detail with reference to the accompanying drawings. FIGS. 10 through 14 are perspective views illustrating methods of fabricating a semiconductor memory device according to other embodiments of the inventive concepts.

Figure 10:
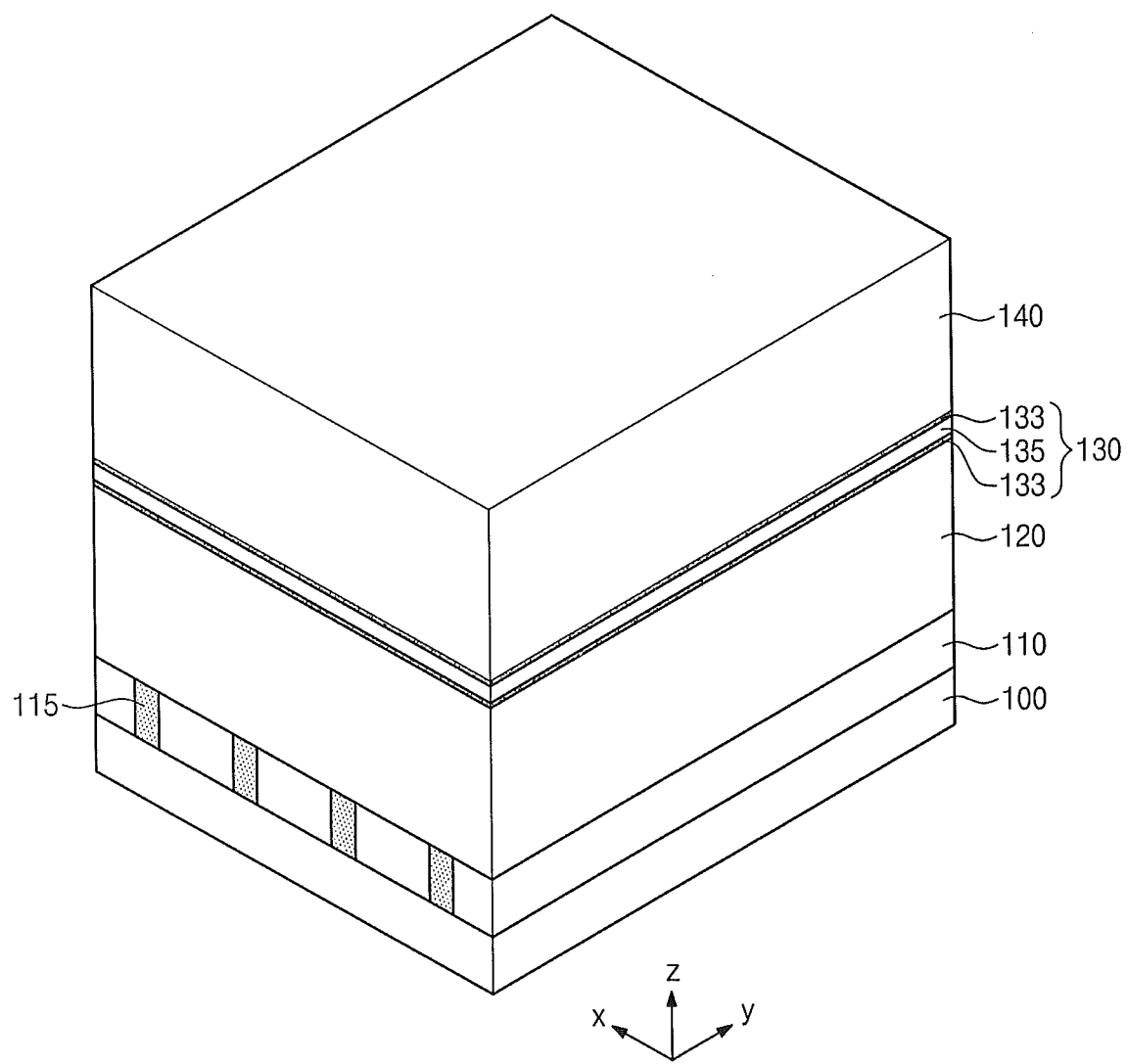

Referring to FIG. 10, a first mold layer 120, a supporting layer 130, and a second mold layer 140 may be sequentially formed on a substrate 100. The supporting layer 130 may include a pair of first layers 133 and a second layer 135 interposed between the pair of the first layers 133.

The first mold layer 120 and the second mold layer 140 may be formed to have the same technical features as those of the previous embodiments described with reference to FIGS. 2 through 9. The pair of the first layers 133 and the second layer 135 may be formed to include the same materials as those of the previous embodiments described with reference to FIGS. 2 through 9.

Figure 11:
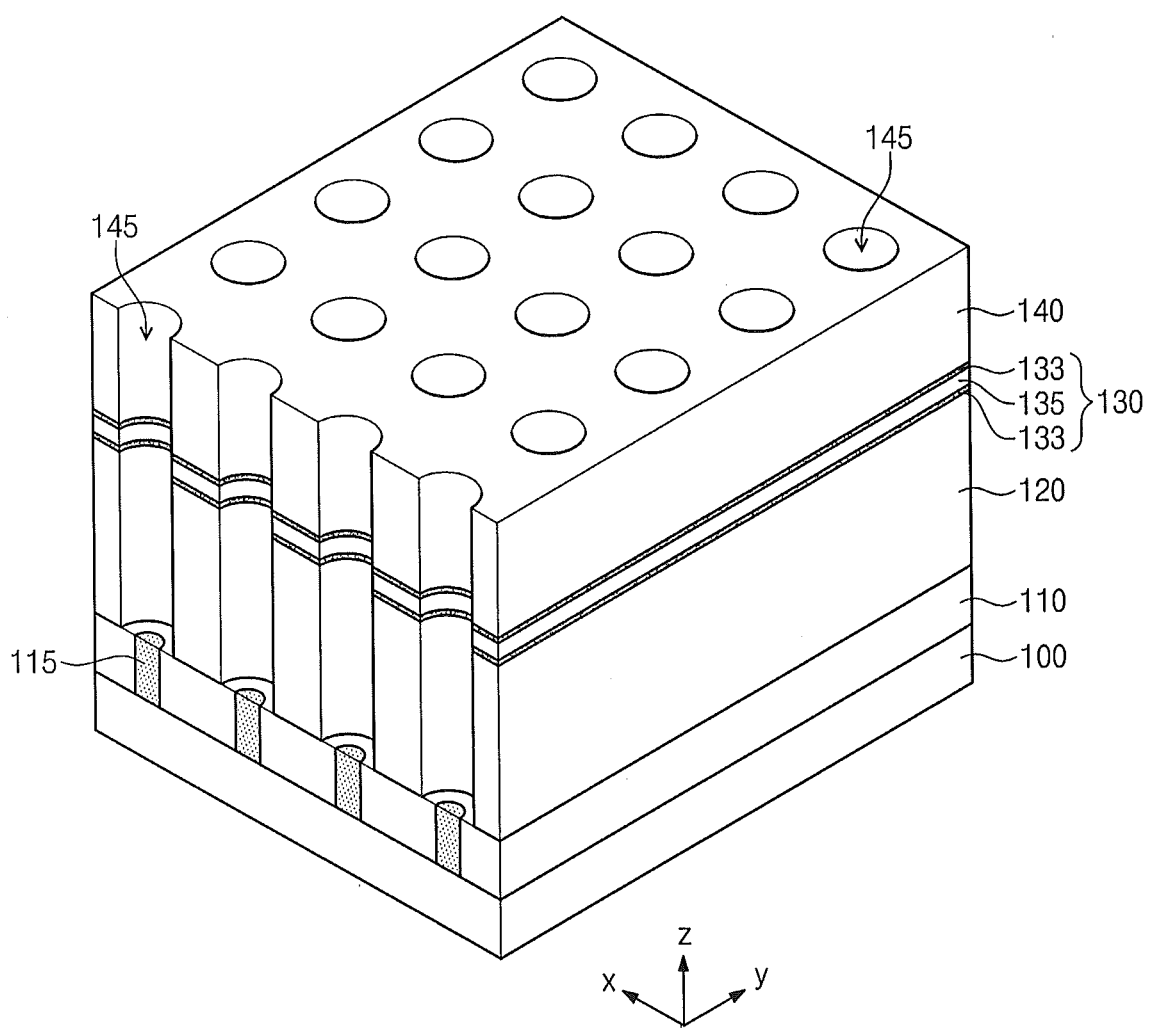

Referring to FIG. 11, holes 145 may be formed on the substrate 100 to penetrate the first mold layer 120, the supporting layer 130, and the second mold layer 140. Each of the holes 145 may be formed to expose the corresponding one of the contact plugs 115.

Figure 12:
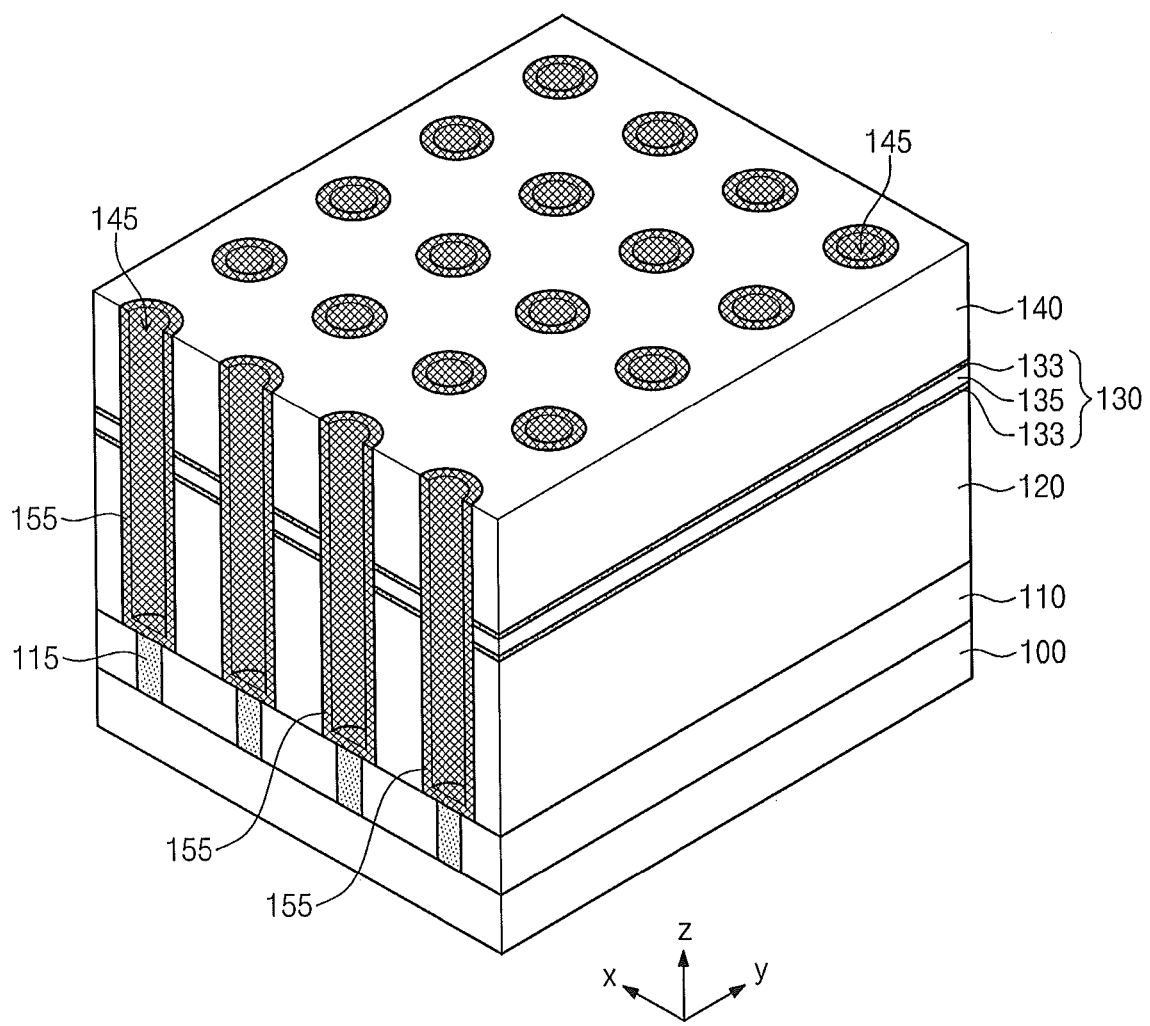

Referring to FIG. 12, storage nodes 155 may be formed in the holes 145, respectively. The storage nodes 155 may be formed to have the same technical features as those of the previous embodiments described with reference to FIGS. 2 through 9.

Figure 13:
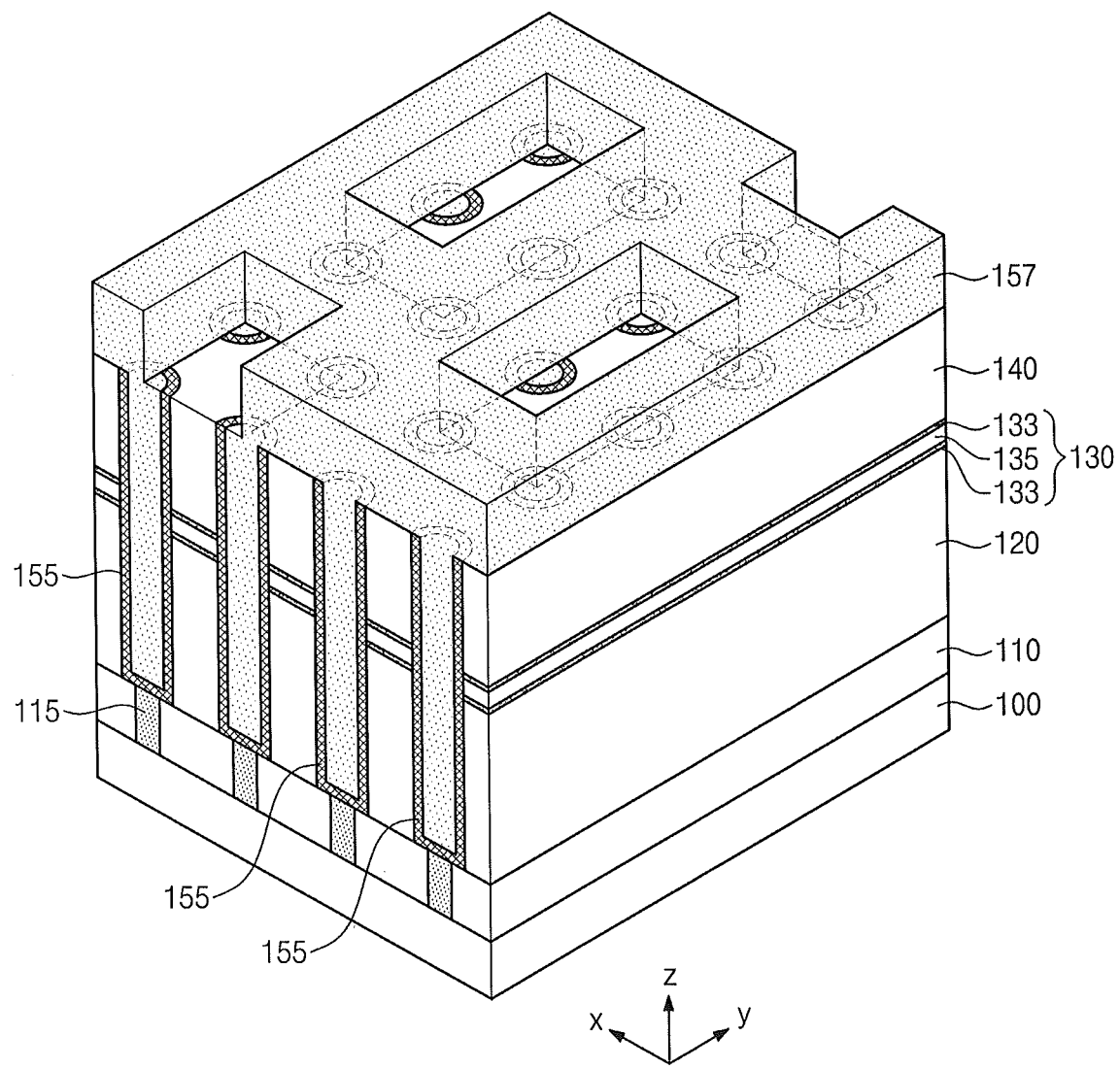

Referring to FIG. 13, a mask pattern 157 may be formed on the second mold layer 140. The formation of the mask pattern 157 may include forming a mask layer on the second mold layer 140 to fill the holes 145 and then patterning the mask layer to expose portions of an upper surface of the second mold layer 140.

Figure 14:
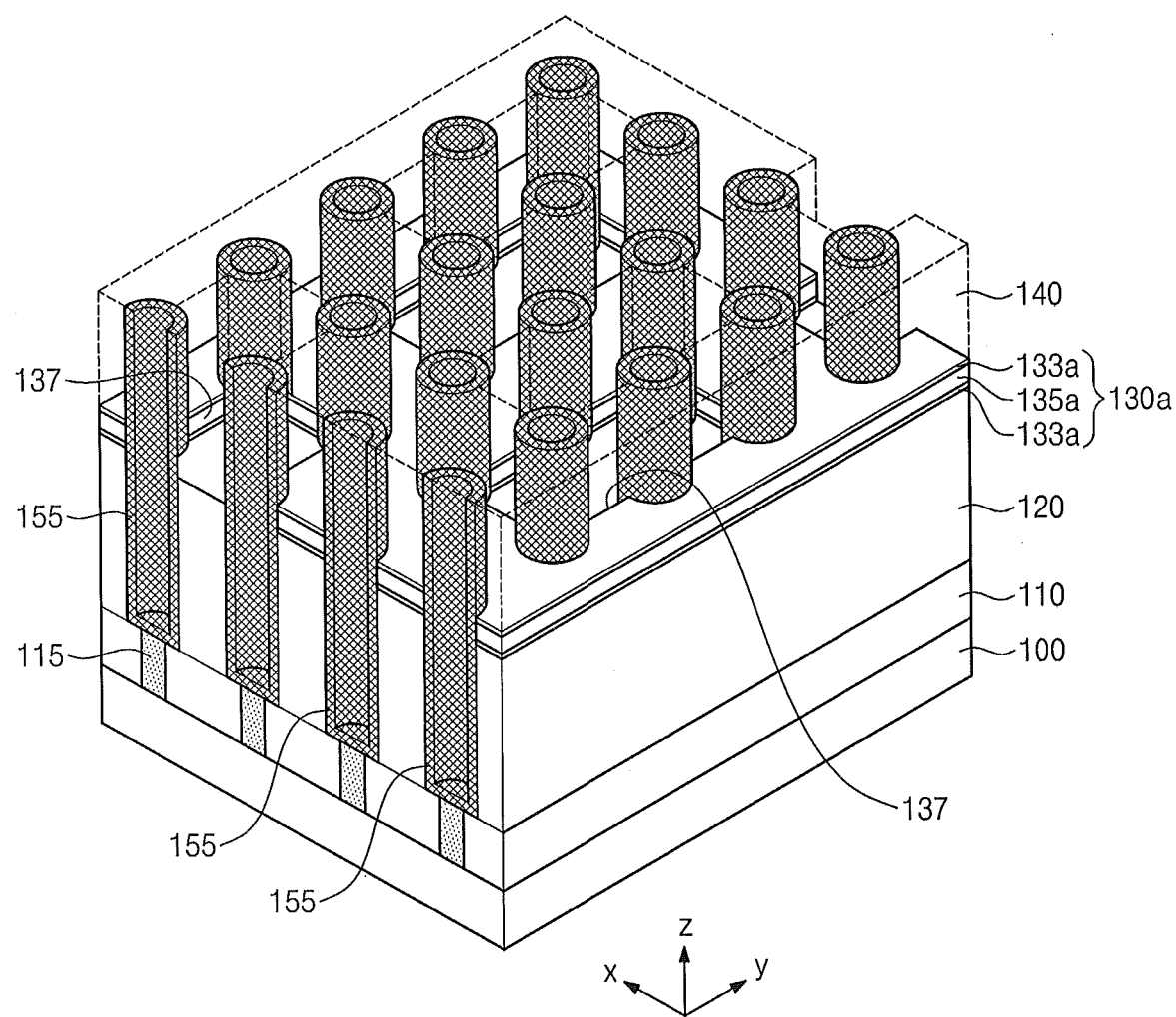

Referring to FIG. 14, the exposed portion of the second mold layer 140 and the supporting layer 130 may be etched using the mask pattern 157 as an etch-mask. As the result of the etching, the supporting layer 130 is patterned to form a supporting pattern 130a having openings. Here, at least one of the openings may be formed to expose at least a portion of top surface of the first mold layer 120. The supporting pattern 130a may include a pair of first patterns 133a and a second pattern 135a therebetween. The pair of the first patterns 133a may be a resultant structure obtained by etching the pair of the first layers 133, and the second pattern 135a may be a resultant structure obtained by etching the second layer 135. The pair of the first patterns 133a and the second pattern 135a may be the same as those of the previous embodiments described with reference to FIGS. 2 through 9, in terms of at least one of shape, structure, and material.

Thereafter, the first mold layer 120 and the second mold layer 140 may be removed. A capacitor dielectric 160 may be conformally formed on the resultant structure in which the first and second mold layers 120 and 140 are removed. The resultant structure provided with the capacitor dielectric 160 may have the structure depicted in FIG. 9.

The present embodiment described above may exhibit the same effect as the previous embodiment described with reference to FIGS. 2 through 9.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

Figure 15:
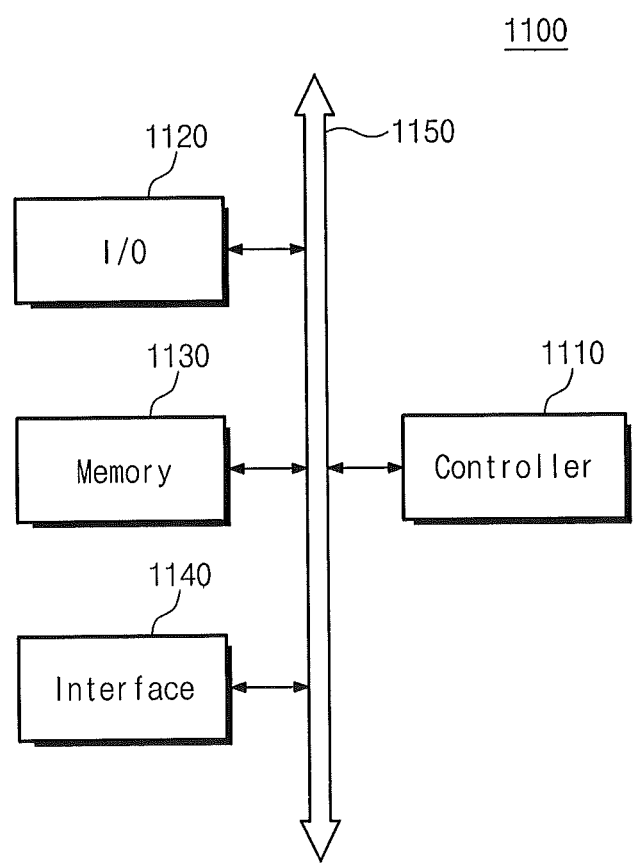

FIG. 15 is a schematic block diagram illustrating an example of electronic systems including semiconductor memory devices according to embodiments of the inventive concept.

Referring to FIG. 15, an electronic system 1100 according to an embodiment may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include at least one of the semiconductor memory devices according to the embodiments described above. The memory device 1130 may further include another type of semiconductor memory devices which are different from the semiconductor memory devices described above. For example, the memory device 1130 may further include a magnetic memory device, a phase change memory device, a dynamic random access memory (DRAM) device and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data wirelessly.

Figure 16:
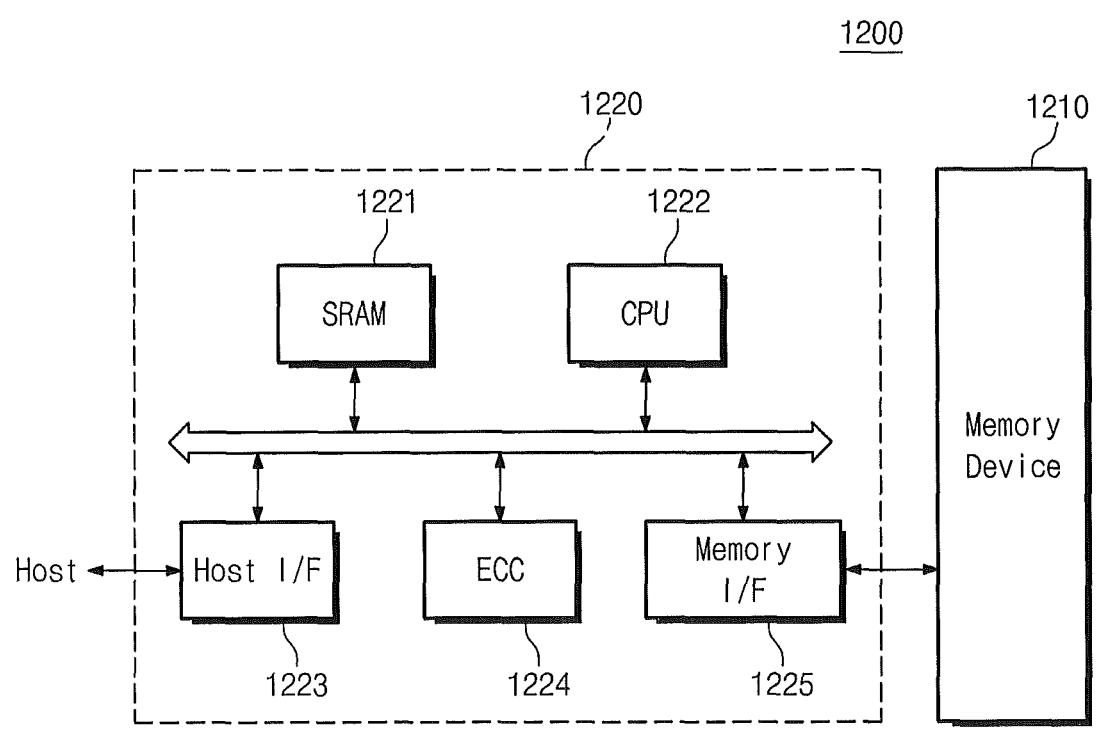

FIG. 16 is a schematic block diagram illustrating an example of memory cards including the semiconductor memory devices according to the embodiments of the inventive concept.

Referring to FIG. 16, a memory card 1200 according to an embodiment of the inventive concept may include a memory device 1210. The memory device 1210 may include at least one of the semiconductor memory devices according to the various embodiments mentioned above. In other embodiments, the memory device 1210 may further include another type of semiconductor memory devices which are different from the semiconductor memory devices according to the embodiments described above. For example, the memory device 1210 may further include a nonvolatile memory device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory card 1200 may further include a read only memory (ROM) device that stores code data to interface with the host. The memory card 1200 may be used as a portable data storage card. Alternatively, the memory card 1200 may replace hard disks of computer systems as solid state disks (SSD) of the computer systems.

According to the afore-described embodiments of the inventive concepts, storage nodes, which may be parts of memory capacitors, are supported by a supporting pattern including at least one first pattern and at least one of second pattern. Here, the first pattern may include a material having an etch selectivity with respect to the second pattern. Accordingly, it is possible to realize the supporting pattern for supporting the storage nodes. This may reduce product failures resulting from a leaning of the storage nodes.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
    a storage node and an electrode layer disposed on a substrate;
    a capacitor dielectric between the storage node and the electrode layer; and
    a supporting pattern connected to the storage node,
    wherein the supporting pattern comprises at least one first pattern and at least one second pattern layered on one another, and the first pattern comprises a material having an etch selectivity with respect to the second pattern;
    wherein the first pattern comprises a pair of the first patterns, and the second pattern is between the pair of the first patterns;
    wherein one of the pair of the first patterns comprises a material exhibiting a tensile stress characteristic, and the other of the pair of the first patterns comprises a material exhibiting a compressive stress characteristic, and a first portion of the second pattern is in contact with the one of the pair of the first patterns exhibiting the tensile stress characteristic and a second portion of the second pattern is in contact with the other of the pair of the first patterns exhibiting the compressive stress characteristic; and
    wherein the first portion of the second pattern exhibits a tensile stress characteristic and the second portion of the second pattern exhibits a compressive stress characteristic.

2. The device of claim 1, wherein the pair of the first patterns comprises an insulating carbon-nitrogen compound, and the second pattern comprises an insulating carbon-free compound.

3. The device of claim 1, wherein the pair of the first patterns comprises a material deposited at a first deposition rate and the second pattern comprises a material deposited at a second deposition rate, and wherein the first deposition rate is less than the second deposition rate.

4. The device of claim 1, wherein the supporting pattern is in contact with at least a portion of a sidewall of the storage node.

5. A semiconductor memory device, comprising:
a plurality of a vertically oriented capacitor storage nodes spaced apart from one another on a substrate each having sidewalls; and
a supporting pattern, above and spaced apart from the substrate, bridging between ones of the plurality of vertically oriented capacitor storage nodes, configured to maintain the sidewalls parallel to one another and vertical relative to the substrate,
wherein the supporting pattern comprises a pair of first patterns and the second pattern between the pair of the first patterns;
wherein one of the pair of the first patterns comprises a material exhibiting a tensile stress characteristic, and the other of the pair of the first patterns comprises a material exhibiting a compressive stress characteristic, and a first portion of the second pattern is in contact with the one of the pair of the first patterns exhibiting the tensile stress characteristic and a second portion of the second pattern is in contact with the other of the pair of the first patterns exhibiting the compressive stress characteristic; and
wherein the first portion of the second pattern exhibits a tensile stress characteristic and the second portion of the second pattern exhibits a compressive stress characteristic.

6. The device of claim 5, wherein the one of the pair of the first patterns and the second pattern have a respective etch selectivity relative to the other.

7. The device of claim 6, wherein the other of the pair of the first patterns has the same etch selectivity relative to the second pattern as the one of the pair of the first patterns.

8. The device of claim 6, wherein the one of the pair of the first patterns comprises an insulating carbon-nitrogen compound, and the second pattern comprises an insulating carbon-free compound.

9. The device of claim 5, wherein the supporting pattern further comprises at least one opening therein having a boundary that contacts directly adjacent ones of the plurality of vertically oriented capacitor storage nodes.

10. The device of claim 5, further comprising a capacitor dielectric conformally on the plurality of vertically oriented capacitor storage nodes and conformally on the supporting pattern.

* * * * *